United States Patent [19]

Wright

[11] 4,366,430
[45] Dec. 28, 1982

[54] BATTERY BOOSTER CABLE ASSEMBLY

[75] Inventor: Bruce R. Wright, St. Louis, Mo.

[73] Assignee: Associated Equipment Corporation, St. Louis, Mo.

[21] Appl. No.: 372,958

[22] Filed: Apr. 29, 1982

Related U.S. Application Data

[63] Continuation of Ser. No. 191,531, Sep. 29, 1980, abandoned.

[51] Int. Cl.³ .......................... H02J 7/00; H01R 11/00
[52] U.S. Cl. ..................................... 320/25; 339/29 B
[58] Field of Search ................. 307/10 R, 10 BP, 130; 191/12 R; 320/25; 339/29 B, 29 R

[56] References Cited

U.S. PATENT DOCUMENTS 4,163,134  7/1979  Budrose .................. 339/29 B X
4,238,722 12/1980  Ford ........................ 339/29 B X

*Primary Examiner*—Michael L. Gellner
*Attorney, Agent, or Firm*—Cohn, Powell & Hind

[57] ABSTRACT

A battery booster cable assembly includes a pair of booster wires. Each booster wire has first and second ends with a first pair of battery clamps attached to the first ends of the booster wires and the second pair of battery clamps attached to the second end of the booster wires. A switch selectively electrically interconnects the first and second ends of one of the booster wires. A voltage detector is responsive to voltage across the switch for determining if the voltage is greater or less than a predetermined value. A red LED indicates when the detected voltage is greater than the predetermined value, while a green LED indicates when the detected voltage is less than the predetermined value. A solenoid-actuated plunger selectively precludes actuation of the switch when the detected voltage is greater than the predetermined value. The switch and the red and green LED's are carried by a housing which includes two portions selectively slidable between first and second positions. In the first position, the switch is open and the LED's are in view, while in the second position the switch is closed and the LED's are hidden from view.

12 Claims, 6 Drawing Figures

BATTERY BOOSTER CABLE ASSEMBLY

This application is a continuation, of application Ser. No. 191,531, filed Sept. 29, 1980, now abandoned.

BACKGROUND OF THE INVENTION

This invention relates to battery booster cable assemblies in general, and particularly to a battery booster cable assembly having voltage and polarity detecting means.

Booster cables are used for starting vehicles which have partially discharged batteries, and are therefore not capable of starting the vehicles themselves. Typically, a booster cable is attached to an adequately charged battery and to the partially discharged battery of the vehicle to be started. Because gases discharged by batteries are highly explosive, it is important that sparks not occur in the vicinity of the batteries. It is also important that proper polarity of connection be observed when connecting booster cables because an improper connection of booster cables can result in extremely high flow of electrical current and possible generation of explosive gases within a battery. Likewise, the connection of a battery of a different voltage can also result in excessive current flow. Many times the determination of the polarity of the battery requires very close inspection of the battery, and a mistake can be made in the connection of the booster cables and possible subsequent explosion of the battery.

SUMMARY OF THE INVENTION

This battery booster cable assembly includes means for determining the differences in voltages of the batteries as connected to the cables for indicating the polarity of connection of the booster cables, and for determining that the batteries are the same voltage, and includes switch means for making the final electrical connection between the batteries at a point remote from either battery, thereby minimizing the possibility of battery explosion. Since the final electrical connection is not made at the battery clamp, the clamps can all be attached directly to battery terminals for better electrical connection of the good battery to electrical system of the vehicle being boosted.

The battery booster cable assembly for interconnecting batteries includes a pair of booster wires, each having first and second ends. A pair of battery clamps, constituting first battery attachment means, are connected to the first ends of the booster wires, while a second pair of battery clamps, constituting second battery attachment means, are connected to the second ends of the booster wires.

A sliding switch, constituting switch means, is connected to one of the booster wires for selectively interconnecting the first and second ends of the one booster wire. The switch means is provided so that the final electrical connection of the booster cables can be made at a point remote from the battery clamps and battery terminals.

A voltage-detecting means is responsive to voltage across the switch means for determining if said voltage is greater or less than a predetermined value.

In one aspect of the invention, an indicating means is operatively connected to the voltage-detecting means, and includes a red light-emitting diode (LED), constituting first light means, for indicating when said detected voltage is greater than the predetermined value.

The indicating means includes a green light-emitting diode (LED), constituting second light means, for indicating when the detected voltage is less than the predetermined value.

In another aspect of the invention, the voltage-detecting means includes a diode bridge circuit connected across the switch means and a voltage-magnitude detector means connected to the diode bridge circuit. In another aspect of the invention, the voltage magnitude detector means includes a first light-emitting diode. A diode means interconnects the first light-emitting diode and the diode bridge circuit for establishing the predetermined voltage required to actuate the first light-emitting diode.

In yet another aspect of the invention, optical means including the first light-emitting diode and a photo-transistor operatively interconnect the voltage magnitude detector means and the indicating means.

In one aspect of the invention, a second diode bridge circuit is operatively connected to the first and second booster wires for providing a proper polarity operating voltage to the indicating means.

In one aspect of the invention, housing means includes first and second portions interconnected in a sliding relation so as to be selectively slidable between first and second positions. The housing means carries the switch means with selective sliding of the first and second housing portions actuating the switch means. The switch means is open when the housing portions are in the first position and closed when the housing portions are in the second position.

The indicating means is carried by the housing means, and are within view when the housing portions are in the first position and is hidden from view when the housing portions are in the second position.

In another aspect of the invention, the indicating means includes lockout means for preventing selective movement of the housing portions from the first to second positions when the detected voltage is greater than the predetermined value. In yet another aspect of the invention, the lockout means is a solenoid-actuated plunger.

DESCRIPTION OF THE PREFERRED EMBODIMENT

Figure 1:
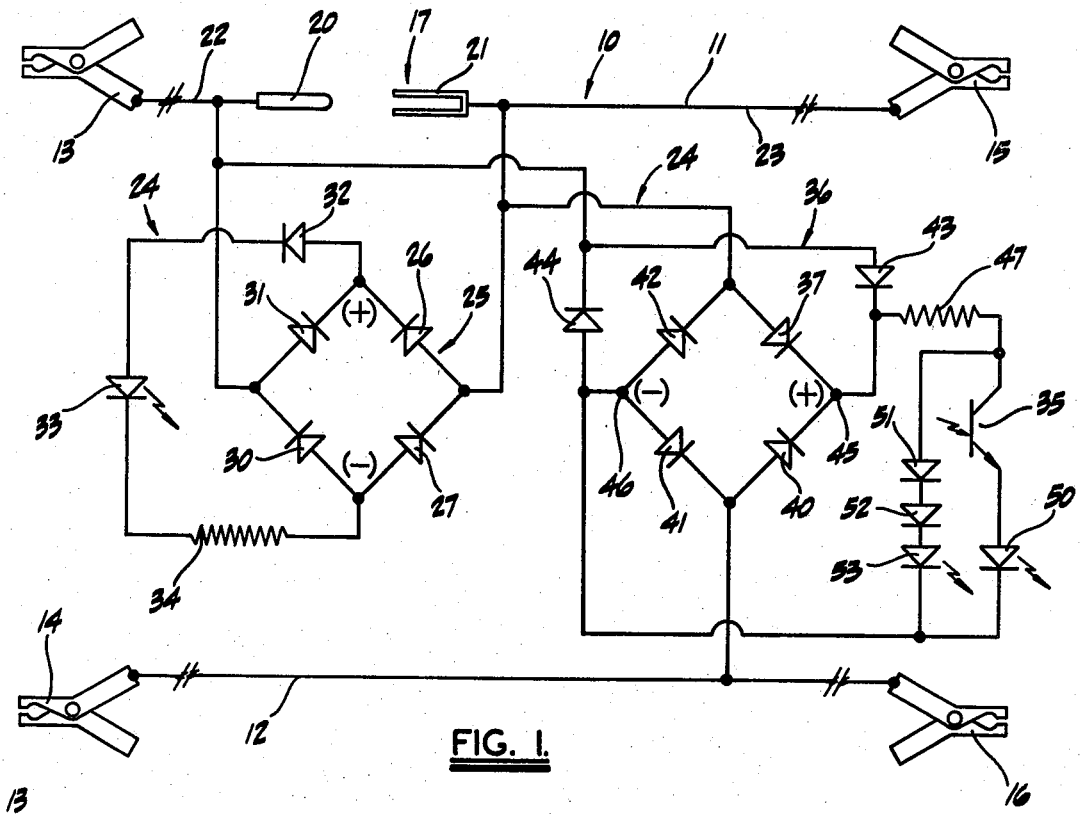
FIG. 1 is an electrical schematic view of the battery booster cable assembly.

Referring now by characters of reference to the drawings and first to FIG. 1, it will be understood that the battery booster cable assembly indicated generally by 10 includes a pair of booster wires 11 and 12. Battery clamps 13 and 14 constituting first battery attachment means are connected to first ends of the booster wires 11 and 12, while battery clamps 15 and 16 constituting second battery attachment means are connected to second ends of booster wires 11 and 12.

A switch 17, constituting switch means, is attached to the booster wire 11. The switch 17 includes a plug portion 20 and a plug-receiving jack 21. The plug portion 20 is connected to a first portion 22 of the booster wire 11, while the plug-receiving jack 21 is connected to a second portion 23 of the booster wire 11. The plug portion 20 is selectively received by the plug-receiving jack 21 for electrically interconnecting the first and second portions 22 and 23 of the booster wire 11.

Voltage-detecting means, indicated generally by 24, are operatively connected across the switch 17. The voltage-detecting means 24 includes a first diode bridge circuit 25 composed of diodes 26, 27, 30 and 31. The input of the diode bridge circuit 25 is connected across the switch 17. Serially connected, across the output of the diode bridge circuit 25 is a voltage magnitude detector means including a diode 32 constituting diode means, a light-emitting diode 33 and a voltage-dropping resistor 34. The light-emitting diode 33 is optically coupled to a photo-transistor 35.

A second diode bridge means, indicated generally by 36, includes diodes 37 and 40–44. The positive output of the diode bridge means 36 is at node 45, while the negative output is at node 46. The diodes 37, 40–42 provide a bridge circuit connected between booster wire 12 and the second portion 23 of the booster wire 11. The diodes 40–41, 43–44, provide a bridge circuit connected between the booster wire 12 and the first portion 22 of the booster wire 11. When the switch 17 is closed to interconnect the first and second portions 22 and 23 of the booster wire 11, the diodes 37 and 43 are connected in parallel, while the diodes 42 and 44 are also connected in parallel, said parallel connector diodes and the diodes 40 and 41 providing a bridge circuit connected between the booster wires 11 and 12.

Operatively, serially connected across the output of the second diode bridge means 36 is indicating means including voltage-dropping resistor 47, the photo-transistor 35 and a red LED 50 providing a first light means. Also, operatively, serially connected across the output of the second diode bridge means 36 are the voltage-dropping resistor 47, diodes 51 and 52 constituting second diode means, and a green LED 53 providing a second light means.

Figure 2:
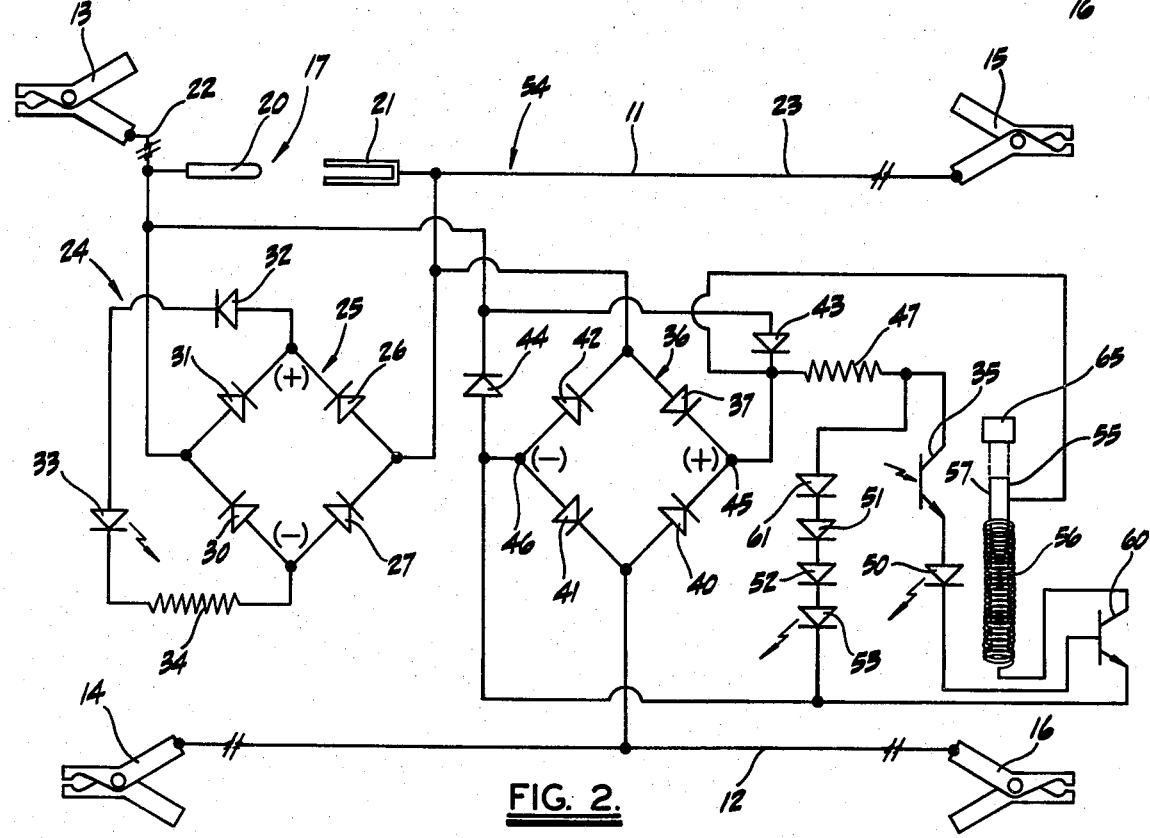
FIG. 2 is an electrical schematic view of a modified battery booster cable assembly.
Figure 3:
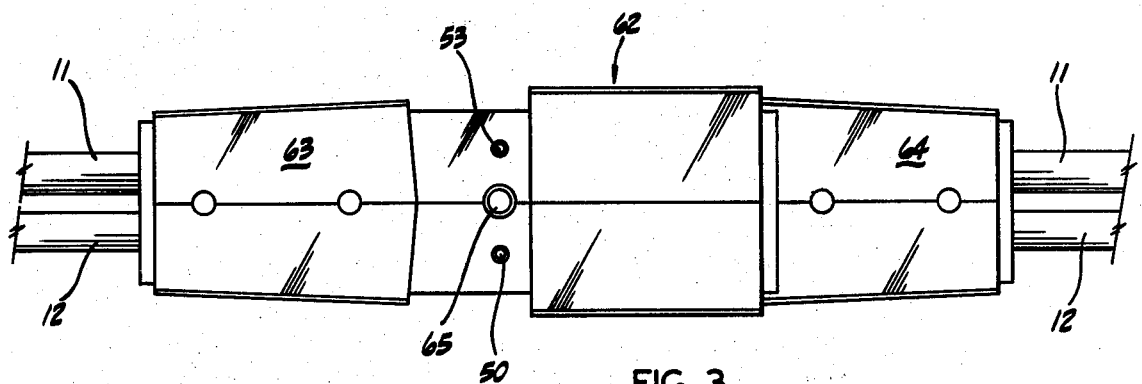
FIG. 3 is a top plan view of the housing portions shown in the first open position.
Figure 4:
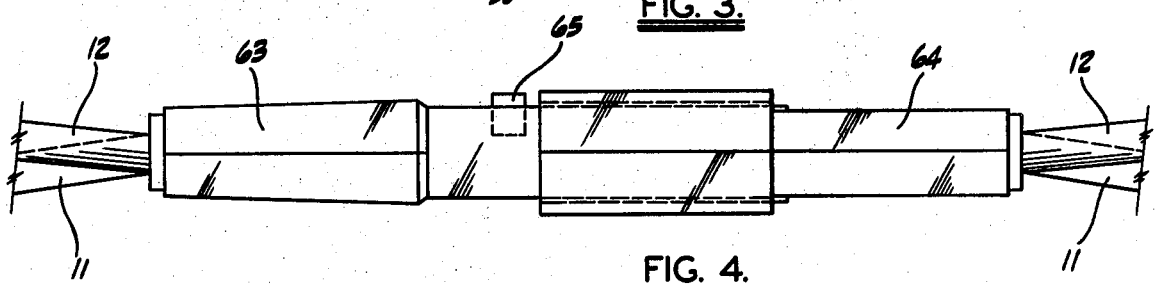
FIG. 4 is a side elevational view of the housing portions of FIG. 3.
Figure 5:
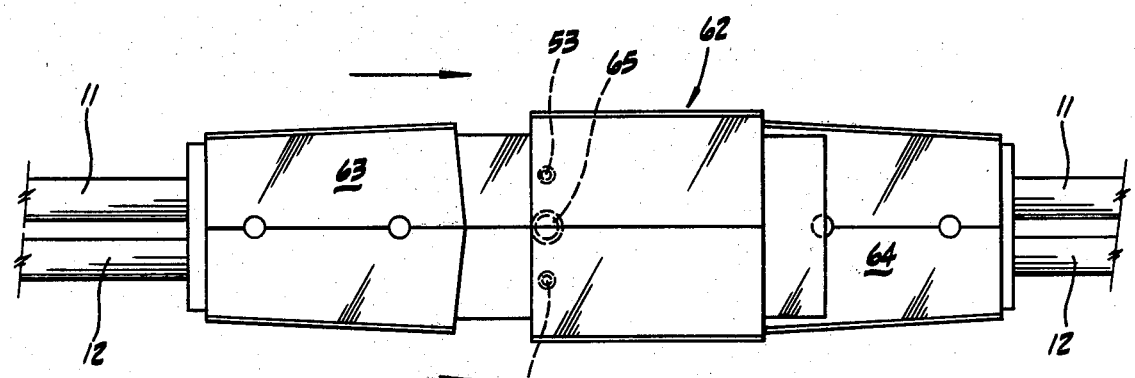
FIG. 5 is a top plan view of the housing portions shown in the closed second position.
Figure 6:
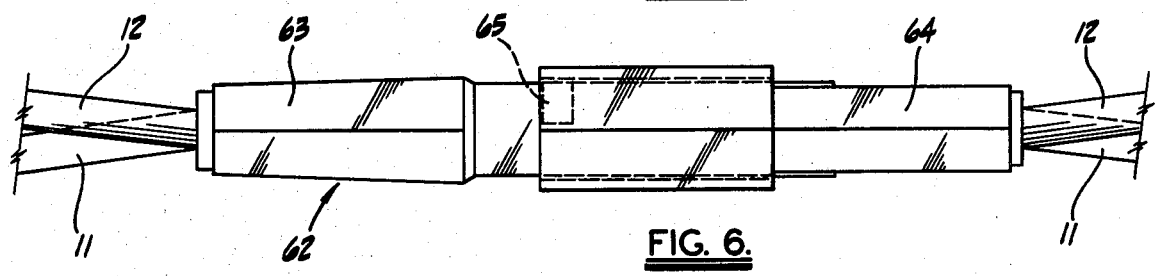
FIG. 6 is a side elevational view of the housing portions of FIG. 5.

Referring now to FIG. 2 in which similar components are given the same reference numerals as in FIG. 1, a modified battery booster cable assembly 54 is disclosed. A solenoid 55, constituting lock-out means, includes a coil 56 and a plunger 57. The solenoid coil 56 is serially connected with a switching transistor 60 across the nodes 45 and 46 of the second diode bridge means 36.

The resistor 47, photo-transistor 35 and red LED 50 serially interconnect the node 45 and the base of the switching transistor 60 for controlling current flow through the switching transistor 60 for actuating the solenoid 55. The second diode means comprising diodes 51 and 52 include an additional diode 61 serially connected with the green LED 53.

Referring now to FIGS. 3–6, a housing means 62 is carried by the booster wires 11 and 12. The housing means 62 includes a first portion 63 and a second portion 64 in sliding relation. The first and second housing portions 63 and 64 are selectively slidable between a first open position disclosed in FIGS. 3 and 4 and a second closed position disclosed in FIGS. 5 and 6. The switch 17 is included within the housing means 62, the switch 17 being open when the housing portions 63 and 64 are in the first position and closed when the housing portions 63 and 64 are in the second position.

The red and green LED's 50 and 53 being in view when the housing portions 63 and 64 are in the first position and are hidden from view when the housing portions 63 and 64 are in the second position.

A lock-out button 65 is provided in the housing portion 63. The button 65 must be depressed in order to move the housing portions 63 and 64 from the first to the second positions.

It is thought that the structural features and functional advantages of the battery booster cable assembly have become apparent from the foregoing description of parts, but for completeness of disclosure a brief description of the operation and the use of the battery booster cable assembly will be given.

Referring first to FIG. 1, the battery booster cable assembly 10 is designed for selectively interconnecting a first and a second battery (not shown). With the switch 17 in an open position, one of the pairs of battery clamps 13 and 14 or 15 and 16 is connected to a first battery. Since the other pair of battery clamps is, as of yet, not connected there will be no voltage applied to the diode bridge circuit 25 and consequently, the light-emitting diode 33 will not light.

The voltage of the first battery will be applied to the second diode bridge circuit means 36. The diode bridge circuit means 36 provides a positive voltage from the first battery at node 45 and a negative voltage at node 46 regardless of whether the booster wire 12 is connected to the battery positive terminal and the booster wire 11 is connected to the battery negative terminal or whether the booster wire 11 is connected to the battery positive terminal and the booster wire 12 is connected to the battery negative terminal. The output voltage, from the diode bridge circuit means 36, is supplied through the dropping resistor 47 for actuating the red or green LED's 50 and 53. Since the LED 33 is not actuated, the photo-transistor 35 will not turn on and the red LED 50 will not light. The green LED 53 will light under these conditions.

Next, the second battery is connected to the other set of the battery clamps. At this time, the voltage appearing across the switch 17 will depend upon the polarity of connection of the two batteries. If the battery clamps 14 and 16 are both connected to battery positive terminals, and the battery clamps 13 and 15 are connected to the battery negative terminals, the batteries are properly connected for polarity. Likewise, if the battery clamps 13 and 15 are connected to the battery positive terminals, and the battery clamps 14 and 16 are connected to the battery negative terminals, the batteries are again properly connected for polarity.

When the batteries are properly connected for polarity, the voltage appearing across the switch 17 is equal to the difference in the voltages of the two batteries. However, if the batteries are connected improperly for polarity, that is, the battery clamps 13 and 16 being connected to positive battery terminals and the battery clamps 14 and 15 being connected to the negative battery terminals or the battery clamps 14 and 15 being connected to the positive battery terminals and the battery clamps 13 and 16 being connected to the negative battery terminals, then the voltage appearing across the switch 17 will be equal to the sum of the voltages of the batteries.

The polarity of the voltage appearing across the switch 17 depends upon the connection of the batteries.

The voltage appearing across the switch 17 is applied through the bridge circuit means 25 to the LED 33. The first diode means 32 is provided for predetermining the value of voltage across the switch 17 required for actuating the LED 33, as for example five (5) volts. The first diode means 32 provides a predetermined voltage drop in series with the LED 33.

If the batteries are properly connected for polarity and are of approximately the same voltage, there will be insufficient voltage applied to the LED 33 to actuate the LED 33 for turning on the photo-transistor 35. However, if the batteries are connected improperly for polarity or if there is a large difference in the battery voltages, such as when connecting a 12 volt battery to a 6 volt battery or a good battery to a completely discharged battery, the voltage output from the diode bridge 25 will be sufficient for actuating the LED 33 and turning on the photo-transistor 35.

With both batteries connected and the switch 17 open, the higher of the two battery voltages will effectively be the voltage supplied from the second diode bridge circuit means 36. If the LED 33 has not been actuated for actuating the phototransistor 35, the red LED 50 will not light and the green LED 53 will remain lighted. This condition indicates proper connection of the battery clamps, and the switch 17 can then be closed for effectuating the interconnection of the two batteries. However, if the voltage across the switch 17 is sufficient to actuate the LED 33 due either to a mismatch polarity of batteries or a mismatch in battery voltages, the photo-transistor 35 will be actuated and thereby turn on the red LED 50.

When the red LED 50 is conducting, the voltage appearing across the diodes 51, 52 and green LED 53 will not be sufficient to actuate the green LED 53 due to the voltage drops introduced by the diodes 51 and 52, which are the second diode means. Therefore the green LED 53 will not be actuated whenever the red LED 50 is actuated.

If the red LED 50 is actuated when the clamps are all connected to the batteries, one pair of the clamps 13 and 14 or 15 and 16 should be reversed in their connection to their associated battery in order to obtain proper polarity of connection. If this reversal does not cause the green LED 53 to light, then a possible hazardous condition such as mismatched battery voltages or a completely dead battery is indicated thereby requiring careful inspection of the polarity and voltages of the batteries.

When the green LED 53 is on, with the battery clamps all connected, the final electrical connection between the batteries can be made by closing the switch 17. Since the switch 17 is located remotely from the batteries, the danger of an arc at the switch 17 which could ignite explosive battery gases is eliminated. When it is desired to disconnect the battery booster cable assembly 10 from the batteries, the switch 17 is first opened so that any arcing that might occur on opening of the switch 17 occurs away from the batteries. The battery clamps 13–16 can then be safely disconnected.

Referring now to FIGS. 3–6, it will be seen that the red and green LED's 50 and 53 are only visible when the housing portions 63 and 64 are in the first position and the switch 17 is open. Therefore in order to utilize the indicating LED's 50 and 53 the user is forced to open the switch 17 in order to view the LED's 50 and 53, therefore assuring that the switch 17 is open before the battery clamps 13–16 are attached to the batteries.

The button 65 must be manually depressed before the housing portions 63 and 64 can be moved to the second position for closing the switch 17. The button 65 is provided for preventing inadvertent sliding of the portions 63 and 64 together, which would close switch 17.

The battery booster cable assembly 54 of FIG. 2 operates similarly to the battery booster cable assembly 10. However it contains an electrically actuated solenoid lockout 55 for preventing the button 65 from being depressed for closing the housing portions 63 and 64 when a dangerous condition is indicated by the lighting of the red LED 50.

The output of the second diode bridge means 36 is applied to the solenoid coil 56 through the switching transistor 60. The red LED 50 is serially connected to the base of the switching transistor 60 for turning on the switching transistor 60 whenever the red LED 50 is actuated by the photo-transistor 35. Because a base to emitter voltage drop in the switching transistor 60 has been serially connected with the red LED 50, the second diode means includes an additional diode 61 which is serially connected with the green light-emitting diode 53 to provide an additional voltage drop in series with the green light-emitting diode 53 to assure that there will be insufficient voltage for lighting the green LED 53 whenever the red LED 50 is on. The solenoid plunger 57 selectively engages the button 65 for retaining the button 65 is an up position, thereby preventing manual closing of the housing portions 63 and 64 when the switching transistor 60 is turned on.

I claim as my invention:
1. A battery booster cable assembly, comprising:
(a) a pair of booster wires, each booster wire having first and second ends,
(b) first battery attachment means connected to the first ends of the booster wires,
(c) second battery attachment means connected to the second ends of the booster wires,
(d) indicating means including light means responsive to voltages applied to the booster wires,
(e) switch means connected to one of the booster wires for selectively electrically interconnecting the first and second ends of said one booster wire,
(f) housing means including first and second portions interconnected in a sliding relation, so as to be selectively slidable between a first position and a second position, and
(g) the housing means carrying the switch means and actuating the switch means upon selectively sliding the housing portions between the first and second positions, the switch means being open when the housing portions are in the first position and closed when the housing portions are in the second position.
2. A battery booster cable assembly as defined in claim 1, in which:
(h) the light means is carried by the housing means, the light means being in view when the housing portions are in said first position, and hidden from view when the housing portions are in said second position.
3. A battery booster cable assembly as defined in claim 1, in which:
(h) a voltage-detecting means is responsive to voltage across the switch means for determining if said voltage is greater or less than a predetermined value, and
(i) a lockout means is actuated by the voltage-detecting means for preventing selective movement of the housing portions from the first to second positions when said detected voltage is greater than said predetermined value.

4. A battery booster cable assembly as defined in claim 3, in which:
(j) the lockout means is a solenoid-actuated plunger.

5. A battery booster cable assembly, comprising:
(a) a pair of booster wires, each booster wire having first and second ends,
(b) first battery attachment means connected to the first ends of the booster wires,
(c) second battery attachment means connected to the second ends of the booster wires,
(d) switch means connected to one of the booster wires for selectively electrically interconnecting the first and second ends of said booster wire, and
(e) voltage-detecting means, connected across the switch means for directly measuring the voltage across the switch means for determining if the magnitude of said measured voltage is greater or less than a predetermined value.

6. A battery booster cable assembly as defined in claim 5, in which:
(f) an indicating means, operatively connected to the voltage-detecting means, includes a first light means for indicating when the magnitude of said detected voltage across the switch is greater than the said predetermined value.

7. A battery booster cable assembly as defined in claim 6, in which:
(g) the indicating means includes a second light means for indicating when the magnitude of said detected voltage across the switch is less than said predetermined value.

8. A battery booster cable assembly, comprising:
(a) a pair of booster wires, each booster wire having first and second ends,
(b) first battery attachment means connected to the first ends of the booster wires,
(c) second battery attachment means connected to the second ends of the booster wires,
(d) switch means connected to one of the booster wires for selectively electrically interconnecting the first and second ends of said one booster wire,
(e) voltage-detecting means, responsive to voltage across the switch means for determining if said voltage is greater or less than a predetermined value, and
(f) a lockout means operatively connected to the voltage-detecting means for selectively precluding actuation of the switch means when said detected voltage is greater than said predetermined value.

9. A battery booster cable assembly, comprising:
(a) a pair of booster wires, each booster wire having first and second ends,
(b) first battery attachment means connected to the first ends of the booster wires,
(c) second battery attachment means connected to the second ends of the booster wires,
(d) switch means connected to one of the booster wires for selectively electrically interconnecting the first and second ends of said one booster wire,
(e) voltage-detecting means, responsive to voltage across the switch means for determining if said voltage is greater or less than a predetermined value,
(f) the voltage-detecting means including:
  (1) a diode bridge circuit connected across the switch means, and
  (2) a voltage magnitude detector means connected to the diode bridge circuit,
(g) an indicating means operatively connected to the voltage magnitude detector means,
(h) the voltage magnitude detector means including a first light-emitting diode, and
(i) the indicating means including a photo-transistor which is actuated by the first light-emitting diode.

10. A battery booster cable assembly as defined in claim 9, in which:
(j) the indicating means includes a second light-emitting diode connected to and actuated by the photo-transistor for indicating when said detected voltage is greater than the said predetermined value.

11. A battery booster cable assembly, comprising:
(a) a pair of booster wires, each booster wire having first and second ends,
(b) first battery attachment means connected to the first ends of the booster wires,
(c) second battery attachment means connected to the second ends of the booster wires,
(d) switch means connected to one of the booster wires for selectively electrically interconnecting the first and second ends of said one booster wire,
(e) voltage-detecting means, responsive to voltage across the switch means for determining if said voltage is greater or less than a predetermined value,
(f) the voltage-detecting means including:
  (1) a diode bridge circuit connected across the switch means, and
  (2) a voltage magnitude detector means connected to the diode bridge circuit, and
(g) the voltage magnitude detector means including:
  (1) a light-emitting diode, and
  (2) diode means interconnecting the light-emitting diode and the diode bridge circuit for establishing the said predetermined voltage required to actuate the light-emitting diode.

12. A battery booster cable assembly, comprising:
(a) a pair of booster wires, each booster wire having first and second ends,
(b) first battery attachment means connected to the first ends of the booster wires,
(c) second battery attachment means connected to the second ends of the booster wires,
(d) switch means connected to one of the booster wires for selectively electrically interconnecting the first and second ends of said one booster wire,
(e) voltage-detecting means, responsive to voltage across the switch means for determining if said voltage is greater or less than a predetermined value,
(f) a lockout means operatively connected to the voltage-detecting means for selectively precluding actuation of the switch means when said detected voltage is greater than said predetermined value,
(g) the voltage-detecting means including:
  (1) a diode bridge circuit connected across the switch means, and
  (2) a voltage magnitude detector means connected to the diode bridge circuit,
(h) an indicating means operatively connected to the voltage magnitude detector means, and
(i) the indicating means including:
  (1) a first light-emitting diode for indicating when said detected voltage is greater than said predetermined value, and
  (2) a second light-emitting diode for indicating when said detected voltage is less than said predetermined value.

* * * * *